United States Patent [19]

Delfyett, Jr.

[11] Patent Number: 5,652,763
[45] Date of Patent: Jul. 29, 1997

[54] MODE LOCKED LASER DIODE IN A HIGH POWER SOLID STATE REGENERATIVE AMPLIFIER AND MOUNT MECHANISM

[75] Inventor: Peter J. Delfyett, Jr., Oviedo, Fla.

[73] Assignee: University of Central Florida, Orlando, Fla.

[21] Appl. No.: 508,469

[22] Filed: Jul. 28, 1995

Related U.S. Application Data

[62] Division of Ser. No. 236,373, May 2, 1994, Pat. No. 5,469,454.

[51] Int. Cl.$^6$ .................................................. H01S 3/08
[52] U.S. Cl. ........................ 372/107; 372/34; 372/36; 372/92
[58] Field of Search ............................ 372/107, 92, 34, 372/36

[56] References Cited

U.S. PATENT DOCUMENTS

| | | | |
|---|---|---|---|
| 3,597,695 | 8/1971 | Swain et al. | 330/4.3 |
| 4,161,747 | 7/1979 | Jennings | 357/82 |
| 4,191,928 | 3/1980 | Emmett | 330/4.3 |
| 4,194,170 | 3/1980 | Kurnit | 331/94.5 |
| 4,324,452 | 4/1982 | Noguchi et al. | 350/6.7 |
| 4,348,599 | 9/1982 | Pradre et al. | 307/426 |
| 4,357,649 | 11/1982 | LaCroix | 362/217 |
| 4,389,617 | 6/1983 | Kurnit | 330/4.3 |
| 4,394,623 | 7/1983 | Kurnit | 330/4.3 |
| 4,618,783 | 10/1986 | Pradere et al. | 307/426 |
| 4,829,528 | 5/1989 | Band et al. | 372/3 |
| 4,853,543 | 8/1989 | Ozdemir | 250/372 |
| 4,869,068 | 9/1989 | Van Vloten | 62/51.1 |
| 4,896,119 | 1/1990 | Williamson et la. | 330/4.3 |
| 4,910,746 | 3/1990 | Nicholson | 372/68 |
| 4,918,702 | 4/1990 | Kimura | 372/34 |
| 4,928,282 | 5/1990 | Barthelemy et al. | 372/18 |
| 5,031,184 | 7/1991 | Greve et al. | 372/34 |
| 5,091,778 | 2/1992 | Keeler | 358/95 |
| 5,105,434 | 4/1992 | Krupke et al. | 373/69 |
| 5,163,061 | 11/1992 | Moberg | 372/3 |
| 5,250,810 | 10/1993 | Geiger | 250/338.5 |
| 5,251,221 | 10/1993 | Stultz et al. | 372/10 |

(List continued on next page.)

OTHER PUBLICATIONS

Bilbe, R.M., et al., 1990, An Improved Raman Lidar System For the Remote Measurement of Natural gases Released Into The Atmosphere, Measurement Science Technology, 1, No. 6, pp. 495–499. Full date not aval.

(List continued on next page.)

*Primary Examiner*—Leon Scott, Jr.
*Attorney, Agent, or Firm*—Brian S. Steinberger; Law Offices of Brian S. Steinberger

[57] ABSTRACT

A mode locked as a seed source for a solid state regenerative amplifier system is disclosed. The system includes components for forming an external cavity laser with a semiconductor amplifier, exciting and mode locking the cavity laser to emit optical pulses with a linearly time varying optical frequency, collecting and collimating the optical pulses, isolating the optical pulses and amplifying the optical pulses for a selected application. The selected applications include but are not limited to medical imaging, fuel diagnostics, ultrafast spectroscopic measurements, network synchronization, distributed optical clock network, electro-optic sampling, timing Jitter reduction, a source for inducing nonlinear optical effects, and optical time domain relectometry. A mount mechanism support for an optic system is also disclosed. The mount support includes an optic component such as a semiconductor laser diode, a semiconductor optical amplifier, and a fiber optical amplifier as well as mounts for the optic component. The mount further includes a stud for supporting the optic component, cooling and heat-sinking elements for the component, and an isolator for thermally isolating and separating the mounts from the elements. The thermal isolator includes material selected from teflon and double-panel glass. The mounts can further include a vertical mounting block with one side attached to the isolator and a second mounting block positioned perpendicular to and supporting the vertical mounting block.

5 Claims, 4 Drawing Sheets

U.S. PATENT DOCUMENTS

| | | | |
|---|---|---|---|
| 5,252,060 | 10/1993 | McKinnon et al. | 431/12 |
| 5,257,085 | 10/1993 | Ulich et al. | 356/318 |
| 5,260,963 | 11/1993 | Baird et al. | 372/95 |
| 5,270,869 | 12/1993 | O'Brien et al. | 372/36 |
| 5,272,717 | 12/1993 | Stultz | 372/3 |
| 5,276,696 | 1/1994 | Callender | 372/32 |
| 5,351,264 | 9/1994 | Kato et al. | 372/34 |
| 5,355,382 | 10/1994 | Kovacs et al. | 372/36 |
| 5,371,753 | 12/1994 | Adsett | 372/36 |
| 5,386,427 | 1/1995 | Zayhowski | 372/34 |
| 5,394,426 | 2/1995 | Joslin | 372/36 |
| 5,399,858 | 3/1995 | Kinoshita | 372/36 |
| 5,519,720 | 5/1996 | Hirano et al. | 372/36 |
| 5,521,931 | 5/1996 | Biegelsen et al. | 372/36 |
| 5,521,932 | 5/1996 | Marshall | 372/36 |

OTHER PUBLICATIONS

Hanson, F. et al., 1993, Gain Measurements and Average Power Capabilities of Cr3+:LiSrAlF6, Optics Letters, 18, No. 17, pp. 1423–1425. Full Date Not Aval.

MacPherson, D.C., et al., 1989, Stimulated Raman Scattering In the Visible With a Multipass Cell, IEEE Journal of Quantum Electronics, 25, No. 7, 1741–1746. Full Date Not Aval.

Perry, M.D., et al., Better Materials Trigger Cr:LiSAF Laser Development, Laser Focus World, Sep., pp. 85–92. Date Not Aval.

Scott, B.P., et al., 1990, Efficient Raman Energy Extraction in HD, Applied Optics, 20, No. 29, pp. 2217–2218. Full Date Not Aval.

Stalder, M., et al., 1991, Flashlamp Pumped Cr:LiSrAlF6, Applied Physics Letters, 58, (3) 21 Jan. 1991.

Swanson, R.C., et al., 1990, Quantum statistics of the Gain–Narrowed Raman Linewidth in H2, American Physical Society, Physical Review A, 42, No. 11, pp. 6774–6783. Full Date Not Aval.

Zhang, Q., et al., 1992, Electronically Tuned Diode–Laser–Pumped Cr:liSrAlF6 Laser, Optics Letters, 17, No. 1, pp. 4 3–45. Full Date Not Aval.

Bischel, W.K., et al. Wavelength Dependence of Raman Scattering Cross Sections From 200–600nm., pp. 181–187, *Eximers*, 1983, Edited by Rhodes, C.K.

Frey, R., et al., High–efficiency pulse compression with intracavity Raman oscillators, pp. 437–439, Optics Letters, vol. 8, No. 8 Aug. 1983.

Frey, R., et al., High–Efficiency Pulse Compression with Intracavity Raman Amplifiers, pp. 786–796, IEEE journal of Quantum electronics, vol.QE–20, No. 7 Jul. 1984.

De Rougemont, F., et al., High–efficiency pulse compression with externally pumped intracavity Raman oscillators., pp. 460–462, Optics Letters, vol. 9, No. 10, Oct. 1984.

MODE LOCKED LASER DIODE IN A HIGH POWER SOLID STATE REGENERATIVE AMPLIFIER AND MOUNT MECHANISM

This is a divisional of application Ser. No. 08/236,373 filed May 2, 1994, now U.S. Pat. No. 5,469,454.

BACKGROUND AND PRIOR ART

The need exists for a compact, efficient high power ultrafast optical sources for applications in science and engineering fields. Presently, the prevalent ultrafast laser system is the mode locked Titanium Sapphire laser. This laser system requires a large frame Argon ion laser which requires a physical size space of approximately forty(40) square feet. The prior art system further requires cooling water and substantial electrical current which can be impractical for most useful applications. Cooling water requirements are 30 gallons per minute @ 65 degrees F. The electrical requirements include a three phase power supply generating 30 Amps. The prior art systems has poor reliability, and poor maintenance records. Furthermore, the prior art mode locked Titanium Sapphire laser is expensive having a total cost of approximately $150,000.

Thus, a laser system is needed that is capable of operating with a standard electrical wallplug that uses 110 volts of alternating current and should be operable with only one on-off switch. The desired laser system should only occupy a space smaller than a few square feet. The system needed should be reliable in that they should operate for periods of five years without failure. Overall efficiency of laser systems should be near 50 percent. The materials used in the laser system should be cheap, efficient, reliable, readily available and non hazardous. The prior art Argon ion pumped mode locked Titanium Sapphire laser system does not meet these needs.

Prior art laser mounts have poor designs that cause many problems such as but not limited to heat transfer between the components which hastens fatigue and shortens the life span of the various components that make up the laser system. For example, as the laser components heat up during operation, there is usually a heat transfer to the mounts for the laser.

Thus, the need exists for an improved mount mechanism for laser systems.

SUMMARY OF THE INVENTION

The first objective of the present invention is to provide a compact mode locked laser as a seed source for a solid state regenerative amplifier system.

The second object of this invention is to provide an efficient mode locked laser as a seed source for a solid state regenerative amplifier system.

The third object of this invention is to provide a unique self starting mechanism for nonlinearly mode locked laser systems.

The fourth object of this invention is to provide a self sustaining mechanism for nonlinearly mode locked laser systems.

The fifth object of this invention is to provide a method of allowing the synchronization and triggering of solid state amplifier systems in conjunction with the mode locked diode laser.

The sixth object of the invention is to provide a prechirped pulse as the seeded optical pulse in a solid state regenerative amplifier system.

The seventh object of the invention is to provide a mounting structure for a laser to isolate mechanical movements owing to cooling requirements.

A preferred mode locked as a seed source for a solid state regenerative amplifier system comprises means for forming an external cavity laser with a semiconductor amplifier, exciting and mode locking the cavity laser to emit optical pulses with a linearly time varying optical frequency, collecting and collimating the optical pulses, isolating the optical pulses and amplifying the optical pulses for a selected application. The selected applications include but are not limited to medical imaging, fuel diagnostics, ultrafast spectroscopic measurements, network synchronization, distributed optical clock network, electro-optic sampling, timing Jitter reduction, a source for inducing nonlinear optical effects, and optical time domain relectometry.

A preferred mount mechanism support for an optic system comprises an optic component such as a semiconductor laser diode, a semiconductor optical amplifier, and a fiber optical amplifier as well as mounts for the optic component. The mount further includes a stud for supporting the optic component, cooling and heat-sinking elements for the component, and an isolator for thermally isolating and separating the mounts from the elements. The thermal isolator includes material selected from teflon and double-panel glass. The mounts can further include a vertical mounting block with one side attached to the isolator and a second mounting block positioned perpendicular to and supporting the vertical mounting block.

Further objects and advantages of this invention will be apparent from the following detailed description of a presently preferred embodiment which is illustrated schematically in the accompanying drawings.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

THE MODE LOCKED DIODE LASER IN A SOLID STATE REGENERATIVE SYSTEM

The invention disclosed has several key features over the prior art. The subject invention is compact, efficient, has low maintenance, electrical sychronization, low timing jitter, 110 VAC operation, provides a pre-chirped pulse, is bandgap engineerable, is further completely electrically pumped and can be potentially integrable.

The subject invention is compact since the laser system is able to be fit within limited space such as four (4) square feet, instead of the forty (40) square feet required by the prior art Titanium Saphire laser. The subject invention is efficient since the laser system can be operated with 110 VAC from a standard wallplug and thus without the need of excessive power requirements.

The subject invention requires low maintenance which allows the laser system to be contained within a closed permanent structure such as computers and within satellites. This laser system has electrical synchronization capability which facilitates the operation of the laser. The invention has low timing jitter which further facilitates synchronization.

This laser system provides a pre-chirped pulse that avoids the use of a pulse stretcher in standard chirped pulse regenerative amplifier schemes. The invention is bandgap engineerable which allows a user to generate any desirable wavelength from the laser without the need of relying on naturally ocurring lasting transitions in condensed matter.

The subject laser system is completely electrically pumped where an all solid state oscillator allows for mechanical robustness and enhanced reliability. The subject laser system can be integrable on chip and with optical fiber media which allows for direct fabrication with semiconductor electronics and can be manufactured in packages with sizes on the order of a computer disc.

Figure 1:
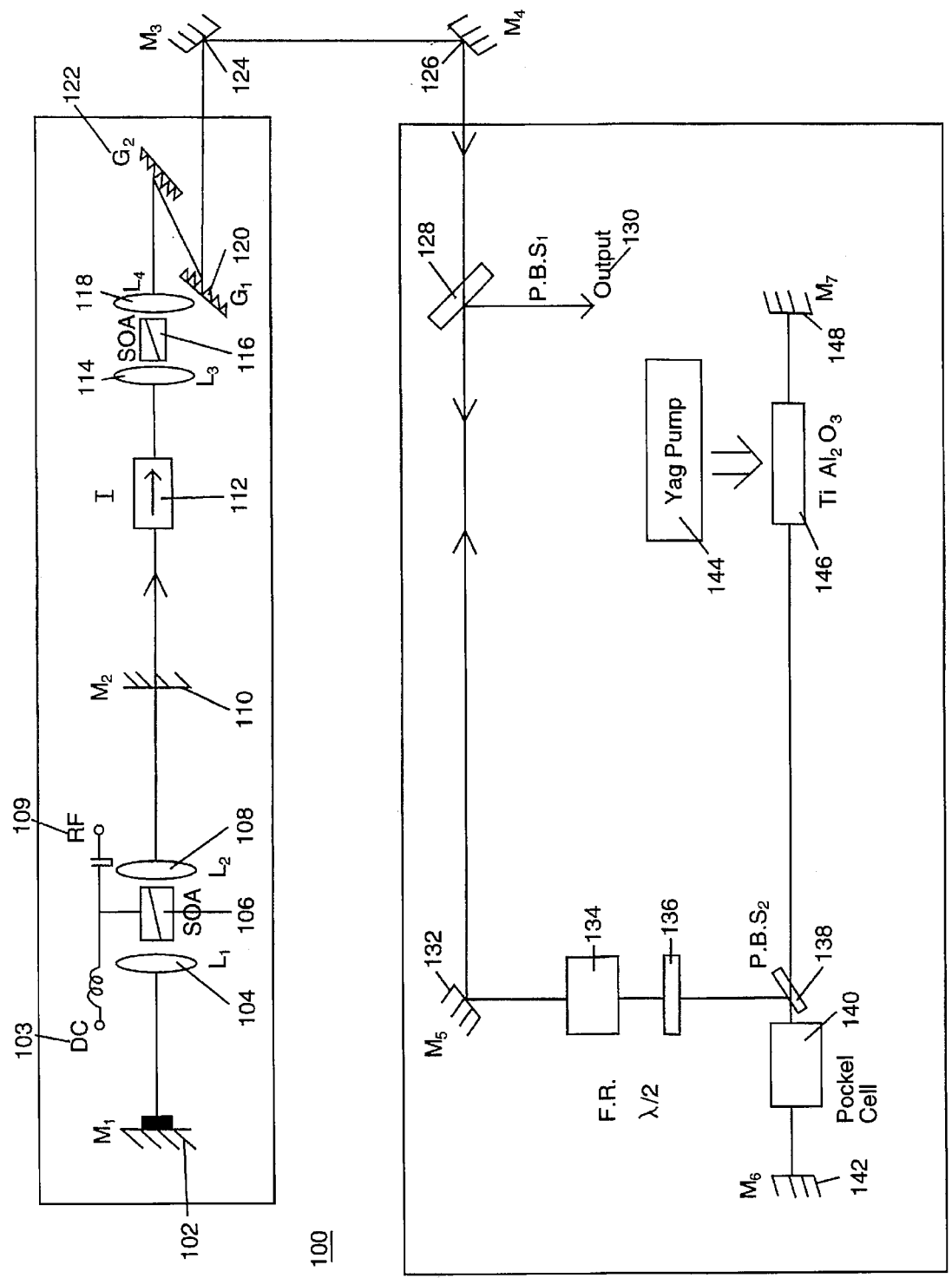
FIG. 1 shows a mode locked diode laser in a solid state regenerative amplifier system of FIG. 1.

FIG. 1 shows a mode locked diode laser in a solid state regenerative amplifier system. This design eliminates the need for an expensive $120,000 to $150,000 Argon ion pump laser and mode-locked Titanium Saphire laser oscillator. The components of the system of FIG. 1 are now defined.

Referring to FIG. 1, M1 through M7 are mirrors. Element 102 is a semiconductor multiple quantum well saturable absorber on a mirror surface structure such as a metal mirror or a dielectric mirror. 110 is an output coupler mirror that can be typically broadband and dielectric with a reflectivity of approximately between 1 and 99%. Elements 124, 126 and 132 are standard dielectric type high reflector mirrors that are used to steer the optical beam. Elements 142 and 148 are high power narrowband dielectric mirrors that help reduce amplified spontaneous emission.

Referring to FIG. 1, L1 to L4 are lens. Elements 104, 108, 114 and 118 are focussing/collimating lenses with large numerical apertures. 106 is the SOA which is a diode such as semiconductor optical amplifier, GaAs/AlGaAs gain guide, thin active region double heterostructure, high power superluminescent laser diode. 112 refers to I which is an optical isolator that can be made from Yttrium Indium Garnet(YIG) placed within a magnetic field that can be designed to operate between 700 nanometers and 900 nanometers. 120 and 122 refer to G1 and G2 respectively which are diffractive grating with 1800 line pairs per millimeter with a gold reflective coatings. 128 and 138 refer to $PBS_1$ and $PBS_2$ respectively, which are high power thin film dielectric polarizing beam splitters that can be designed to operate between 700 nm and 900 nm. Output 130 goes to any application or experiment requiring the output light pulses generated from this invention. 134 refers to FR which is a Faraday Rotator which rotates the plane of polarization depending on which direction the light is traveling. 136 is a wave plate of size $\lambda/2$ which rotates the plane of polarization of the light passing through the device. 140 refers to a pockel cell which is an electro-optic crystal that rotates the plane of polarization of light passing through the device when an electric field is applied. 144 refers to an Nd:YAG solid state laser or similar type laser which pumps or excites the solid state regenerative amplifier medium. 146 refers to the solid state regenerative amplifier gain medium such as Titanium Sapphire: Ti: $Al_2O_3$.

The operation of FIG. 1 will now be discussed. The SOA 106 is placed within an optical resonator thus making an external cavity laser. The SOA/external cavity 106 is excited with DC current 103 and actively mode locked with RF current 109. The SOA/external cavity laser 106 is also passively mode locked by saturable absorber 102. Pre-chirped optical pulses are transmitted through mirror M2 110 and passed through the optical isolator 112. The optical pulses are amplified by a second SOA 116. These pulses can be additionally stretched or compressed if desired by grating pair G1, 120 and G2, 112. The optical pulses are directed toward the solid state regenerative amplifier with turning mirrors M3, 124 and M4, 126. The light is appropriately polarized from the laser such that it is transmitted through PBS1, 128 and injected into the Faraday rotator 134. No optical pulses pass through the half wave plate 136 and the plane of polarization is rotated.

Again referring to FIG. 1, the optical pulses are reflected into the regenerative amplifier cavity M6, 142 and M7, 148, by PBS2, 138. The plane of polarization is rotated by the Pockels cell 140, after a double pass so that the light will not be reflected by PBS2, 138. The optical pulses are amplified in a solid state gain media(e.g. Ti: $Al_2O_3$), 146, which is excited by another pump laser 144. The optical pulses are reflected by M7, 148 returning the optical pulse into the solid state gain media 146 for additional amplification. An electric field is applied to the Pockels cell 140, which alters the birefringence, so that no polarization rotation is experienced. This keeps the optical pulses trapped in the regenerative amplifier cavity. The optical pulses continue to bounce back and forth between mirrors M6 142, and M7 148, and continue to be amplified by the gain media 146. After several round trips, the electric field on the Pockels cell is removed, which allows the plane of polarization of the light pulses to be rotated. The light pulses are then reflected out of the regenerative cavity by PBS2 138. The polarization is rotated again by the half wave plate 136 and also rotated once more by the Faraday rotator 134. The optical pulses are reflected towards PBS1 128, by M5 132. The optical pulses are now reflected out of the system by PBS1 128. The resultant pulses are ultrashort, high power optical pulses at output 130 FIG. 1, which can be directed to an application, measurement, diagnostic equipment and the like, not shown.

Figure 2:
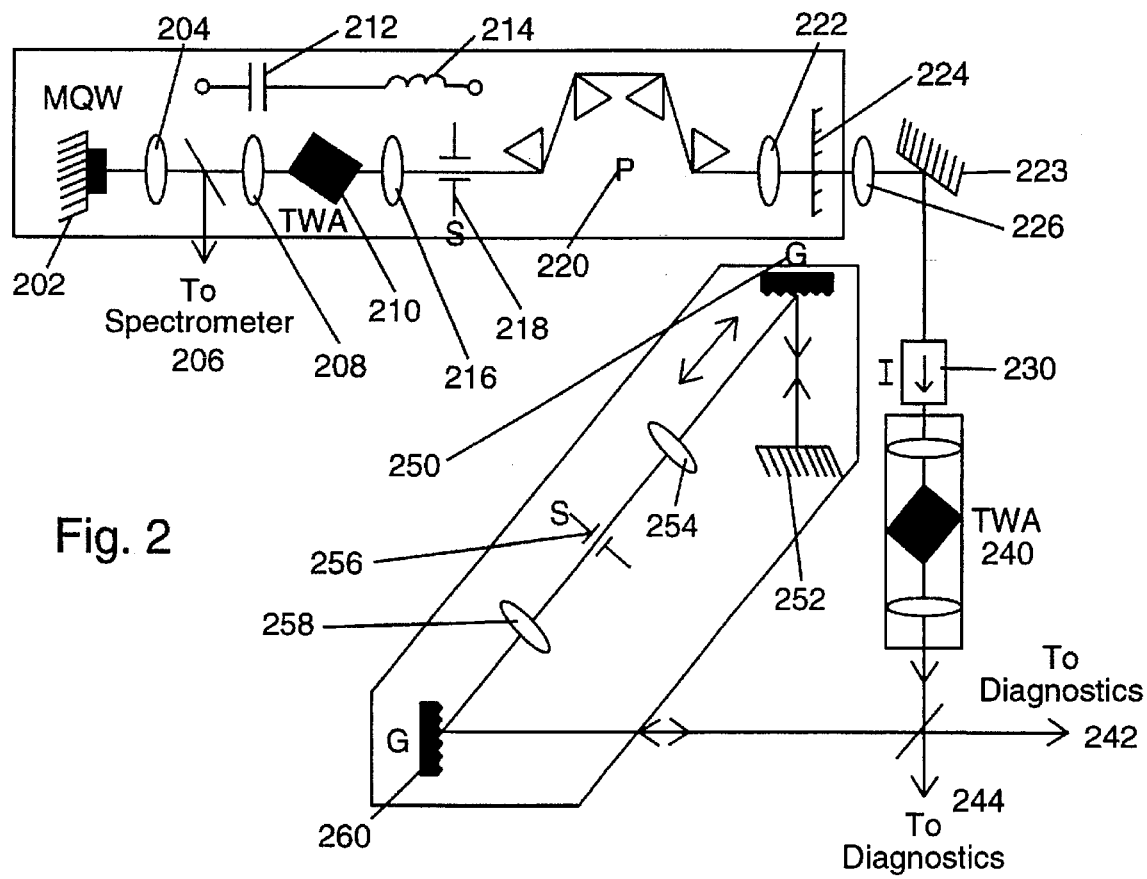
FIG. 2 shows an overall layout of the mode locked diode laser system invention.

FIG. 2 shows a schematic of the mode locked semiconductor laser system of FIG. 1. Time, t is 206 fs and $P \geq 165$ W, $\lambda$ is 838 nm and fm is 335 MHz. The components of FIG. 2 will now be described. 202 refers to a semiconductor multiple quantum well saturable absorber in contact with a high reflector mirror, which is similar to 102 of FIG. 1. Component 204 is a focusing/collimating lense. 206 is a beam splitter. 208 is a focusing/collimating lens. 210 is semiconductor optical amplifier(SOA) or a travelling wave amplifier. 212 and 214 comprise a bias tee. 216 is a focusing/collimating lens. 218 is an adjustable slit. 220 is a four prism sequence. 222 is a collimating/focusing lens. 224 is an output coupler. 226 is a collimating/focusing lens. 228 is a turning mirror. 230 is an isolator. 240 refers to a semiconductor optical amplifier. 242 is an optional stretched/compressed amplified optical pulses which goes to diagnostics as an autocorrelator, photodetector, spectrometer, experiment, application, and the like. 244 are the stretched amplified output optical pulses which goes to diagnostics as an autocorrelator, photodetector, spectrometer, experiment, application, and the like. 250 and 260 are diffraction gratings. 252 is a reflecting mirror. 254 and 258 are lenses in a telescope configuration. 256 is an adjustable slit similar to component 218.

A description of the operation of the components of FIG. 2 will now be described. The SOA 210, is placed in an external optical cavity formed by output coupler 224 and the MQW saturable mirror 202. Both direct current DC and radio frequency RF current is supplied through the bias tee 212, 214. The light emission from SOA 210 is collected and collimated by lenses 208 and 216. Light is focussed on MQW absorber/mirror 202 by lens 204. Light is then directed through slit 218, to control the transverse mode profile. Light is directed through prism sequence P 220 and focussed onto the output coupler 224 by lens 222. When appropriately biased with electric current and optically aligned, the laser becomes mode locked, emitting optical pulses with a linearly time varying optical frequency (chirped pulse). The optical pulses are collected and collimated by lens 226 and directed to an optical isolator 230 by a turning mirror 228. The optical pulses are amplified in SOA 240 and can either be utilized directly at output 244, or directed to an optical dispersion encorporator/compensator 250–260. The output from the dispersion apparatus 242 are high power optical pulses which can be diagnosed, utilized in measurements, experiments, applications and the like.

Figure 3:
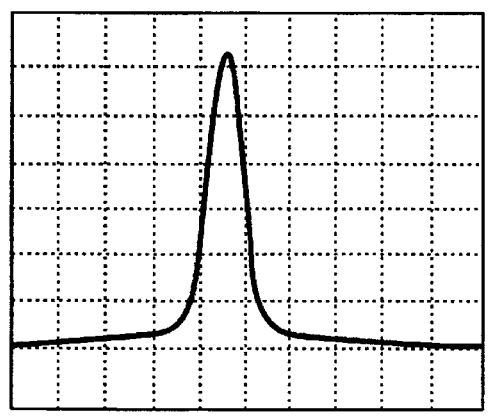
FIG. 3 shows a graph of the generated output optical pulse from the diode laser, which plots the second harmonic intensity autocorrelation function verses time delay.

FIG. 3 is a plot illustrating the performance of the laser system of FIG. 1. In FIG. 3, a generated ultrafast optical pulse is shown compared to the second harmonic intensity autocorrelation function plotted verses the time delay. This plot shows an optical pulse of 207 femtoseconds in duration.

Figure 4:
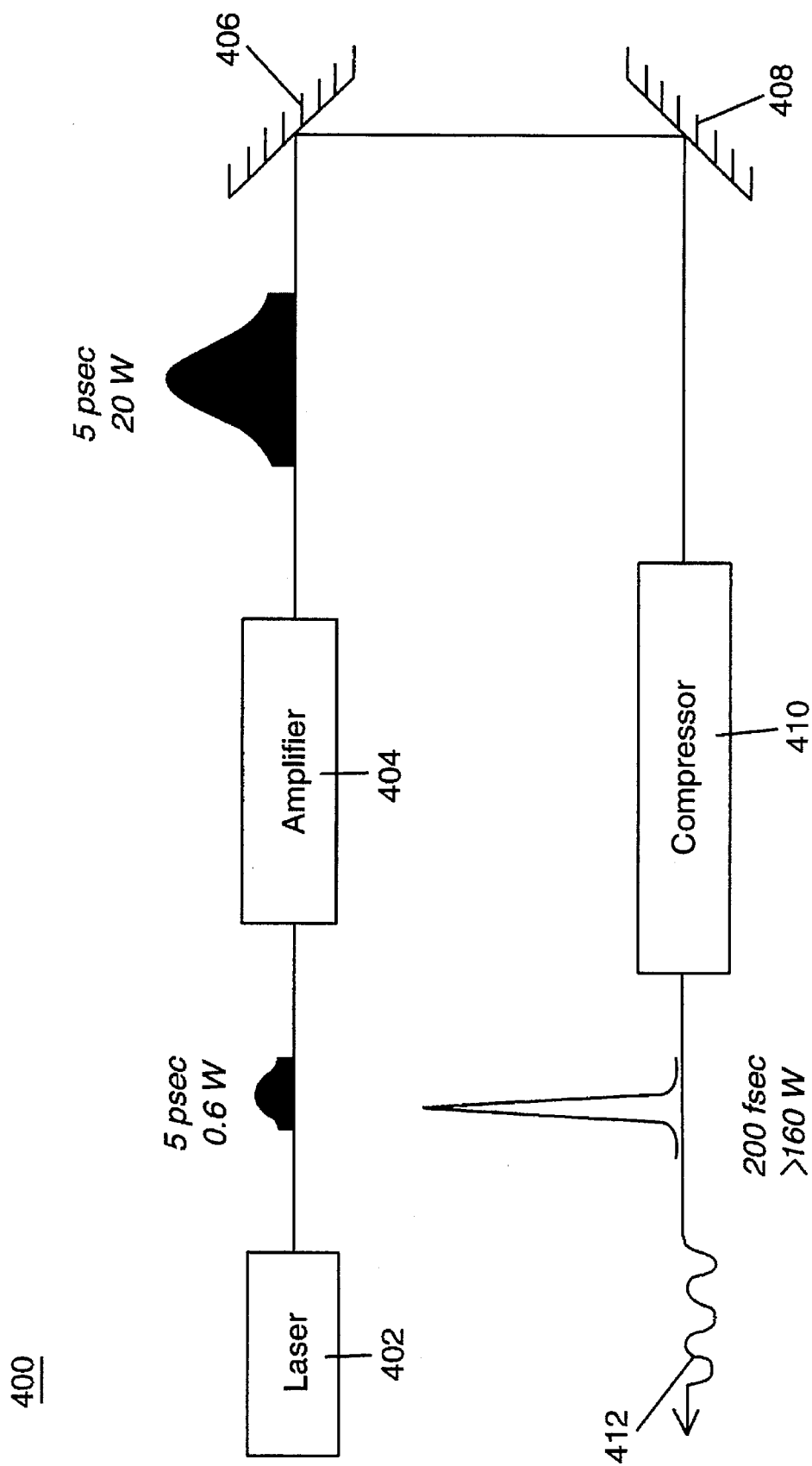
FIG. 4 shows a simplified schematic of the diode laser system of FIG. 1, including the generation and amplification of a chirped pulse with subsequent pulse compression.

FIG. 4 shows a schematic diagram of what the optical pulse looks like at several points in the laser system of FIG. 2. In reference to FIG. 4, 402 refers to a compact, efficient mode locked laser such as a mode locked semiconductor laser. 404 refers to a compact, efficient optical amplifier such as the SOA. Components 406 and 48 refer to mirrors such as to direct light into an optical temporal dispersion system. 410 is an optical dispersion system which can temporally expand or compress optical pulses. And 412 is the resultant high power ultrafast optical pulses which can be used for measurements, applications, experiments and the like. The operation of FIG. 4 corresponds to the operation of components 220 to 260 of FIG. 2.

The laser system described in FIGS. 1 through 4 has application in wide areas such as but not limited to medical imaging, fuel diagnostics, ultrafast spectroscopic measurements, network synchronization, distributed optical clock network, electro-optic sampling, timing Jitter reduction, a source for inducing nonlinear optical effects, and optical time domain relectometry.

In medical imaging applications, ultrashort optical pulses can be used to image structure in optically dense/diffuse media by relying on optical time of flight techniques. In fuel diagnostic applications, ultrashort high power optical pulses can be used as a tool to measure the dynamics of electrons, atoms, molecules and other condensed matter particles on an ultrafast time scale.

In network synchronization applications, a single RF oscillator can be used to drive several mode locked lasers with identical optical cavity lengths. The resultant is several independent, high synchronized optical pulse trains which can be used as master timing devices in computers, local area networks and the like.

In optical clock distribution applications, the precise timing of the generated optical pulse train can be used as analogous ticks of a clock in any system/network/instrument/application which requires a master timing signal. The high output power from the laser allows the optical clocking signal to be split many times thus providing an identical timing signal to many independent locations.

In electro-optic sampling applications, the mode locked diode laser is driven by an RF oscillator. This RF oscillator can also be used to trigger ultrafast electrical signals. Since both the laser and high speed electrical signals are driven by the same RF oscillator, minimal timing uncertainties exist between the ultrafast optical and electronic signals.

In timing jitter reduction, this is a random fluctuation between the time of arrival of two successive optical pulses in the generated optical pulse train. This small timing jitter is the key ingredient which allows one to use the laser in clock distribution, network synchronization and electro-optic sampling.

As a source for inducing nonlinear optical effects, the peak powers achieved by this laser system are sufficient to induce many nonlinear optical effects. Such effects include but are not limited to SHG (second harmonic generation), SPM (self-phase modulation), 4 WM (four wave mixing), and TPA (two photon absorption).

In optical time domain relectometry, this technique is basically an optical radar technique. Here, a short optical pulse is emitted and directed towards an object. The reflected light from the object is collected and the amount of time elapsed between the emitted and reflected optical pulse is measured giving information about the position and location of the object and target.

MOUNT MECHANISM

Figure 5:
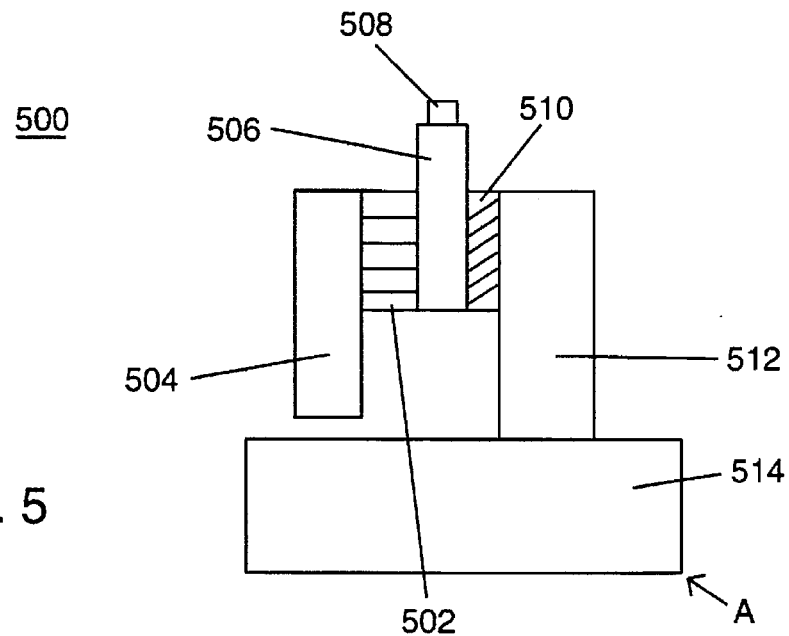
FIG. 5 shows a side view of the laser mount.
Figure 6:
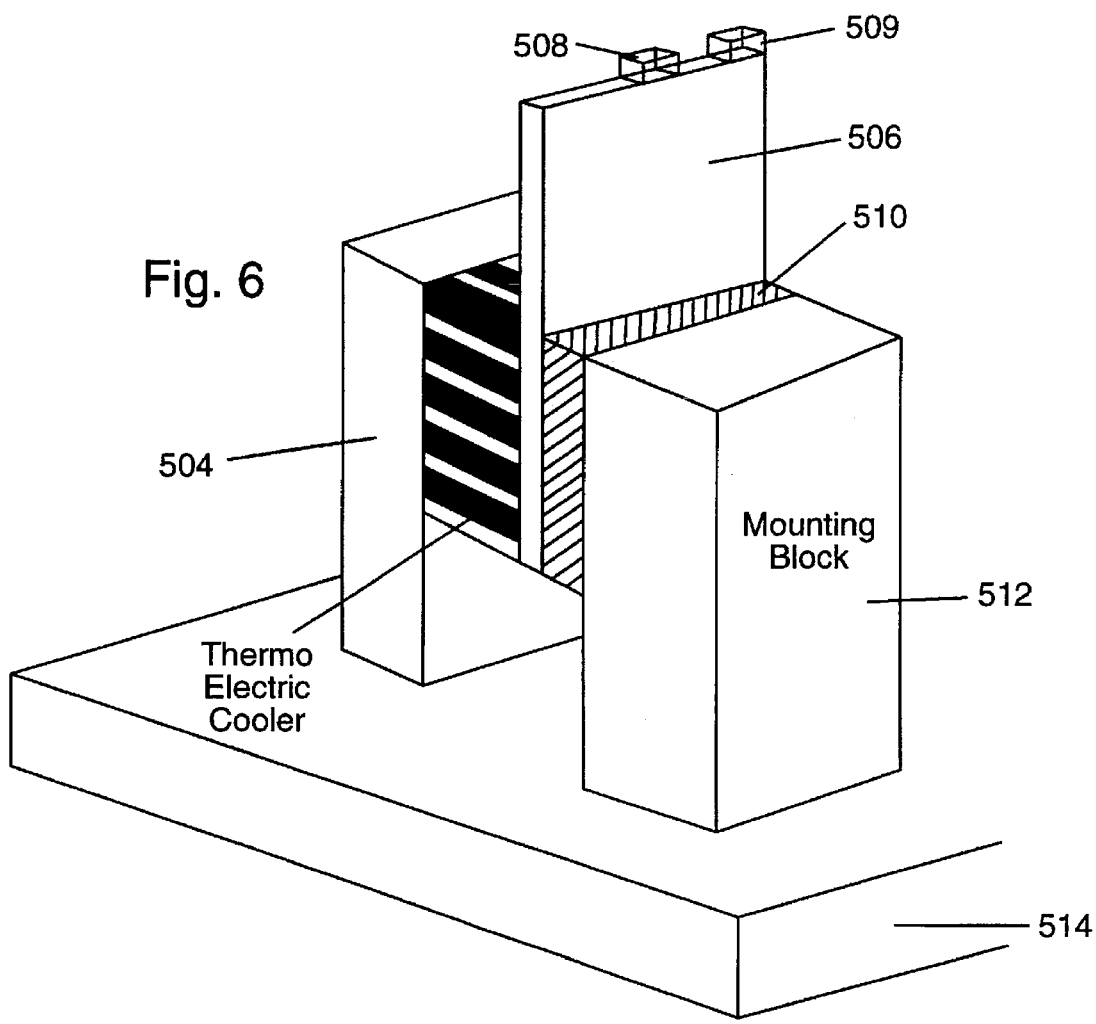
FIG. 6 shows a view of the laser mount of FIG. 5 along arrow A.

FIG. 5 shows a side view of the laser mount 500. FIG. 6 shows a view of the laser mount 500 of FIG. 5 along arrow A. The components of FIGS. 5 and 6 will now be defined. 502 refers to a thermoelectric cooler such as a Melcor thermoelectric cooler, or other Peltier cooling element. 504 is a heat sink for removing heat. 506 is a stud or any other mounting block for a semiconductor optical laser or an amplifier. 508 refers to a semiconductor laser diode, semiconductor optical amplifier, fiber optical amplifier, or any other device which requires operating at a temperature different from the environment and cannot experience any movement while being cooled by the Peltier cooling element. 509 are electrical contacts. 510 is a thermal isolation such as any material or device which does not conduct heat such as but not limited to teflon and doubled panel glass. 512 and 514 respectively refer to mounting blocks such as any material capable of providing sufficient strength and rigidity to support the laser diode, stud, thermoelectric cooler and heat sink such as copper.

Referring to FIGS. 5 and 6, the operation of mounting mechanism 500 will now be discussed. Mounting structure 500 separates mounting blocks 512 and 514 from cooling elements 502 and from heat-sinking elements 504 using thermal isolation means 510. This separation thus avoids small movements caused by the thermoelectric cooler 502 when in operation. Mounting block 514 supports the entire mounting structure. Mounting block 512 supports the laser/stud 506, 508, 509, and is thermally isolated from these components by thermal isolator 510. With this arrangement there is no heat transfer to the mounting structure as laser/stud 506, 508, 509, gets heated by current injection through electrical contact 509. Cooling element 502 provides a means for keeping the laser/stud 506, 508, 509, at an appropriate operating temperature. As the cooling element is operated, small expansions and contractions occur in the cooling element 502. Cooling element 502 is connected to a heat sink 504 which removes heat from the cooling element 502 and the laser/stud device 506, 508, 509. Since the heat sink/cooling element 504 is floating in a cantilever arrangement and is not directly connected to the mounting block 512, 514, the small movements which occur in the cooling element 502 are not transferred to the laser/stud device 506, 508, 509. Thus, the mechanical stability of the laser/stud device is provided by the thermal isolator 510 and mounting blocks 512, 514, while the pathway for heat transfer is through the thermoelectric cooler 502 forming a floating/cantilever heat sink.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

I claim:

1. A cantilever mount support that prevents expansion and contraction movements by cooling and heat sinking means from reaching an attached optical laser/amplifier component that is being cooled by the cooling and heat-sinking means, comprising:

an optic component, the component chosen from one of a laser optical amplifier, a fiber optic amplifier and an optical laser;

a submount having an upper surface, a first side surface and a second side surface, the upper surface for mounting the optic component;

a rigid base mount attached to the first side surface of the submount for rigidly supporting the submount;

cooling and heat-sinking means for cooling the optic component, the cooling and heat-sinking means attached to and cantilevered from the second side surface of the submount; and a thermo-isolator means attached between the submount and the vertical mount for eliminating heat transfer between the optic component and the vertical mount, wherein expansion and contraction movements caused by the cooling and heat-sinking means which would be transferred and passed to the optic component are eliminated.

2. The cantilever mount support for the optic system of claim 1, wherein the submount further includes:

a stud for supporting the optic component.

3. The cantilever mount support for the optic system of claim 1, wherein the thermal isolator includes material selected from at least one of:

Teflon and double-panel glass.

4. The cantilever mount support for the optic system of claim 1, wherein the rigid base mount further includes:

a vertical mounting block with an upper side attached to the first side surface of the submount; and a second mounting block positioned perpendicular to and supporting the vertical mounting block.

5. The cantilever mount support for the optic system of claim 1, wherein the cooling and heat-sinking means further include:

a thermoelectric cooler attached to the second surface of the submount for cooling the optic component; and a heat sink element attached to an opposite side of the thermoelectric cooler.

\* \* \* \* \*